United States Patent
Yang

(10) Patent No.: US 8,458,536 B2
(45) Date of Patent: Jun. 4, 2013

(54) DATA RECOVERY IN SOLID STATE MEMORY DEVICES

(75) Inventor: Xueshi Yang, Cupertino, CA (US)

(73) Assignee: Marvell World Trade Ltd., St. Michael (BB)

(*) Notice: Subject to any disclaimer, the term of this patent is extended or adjusted under 35 U.S.C. 154(b) by 1010 days.

(21) Appl. No.: 12/494,004

(22) Filed: Jun. 29, 2009

(65) Prior Publication Data

US 2010/0017684 A1 Jan. 21, 2010

Related U.S. Application Data

(60) Provisional application No. 61/081,546, filed on Jul. 17, 2008, provisional application No. 61/088,514, filed on Aug. 13, 2008, provisional application No. 61/118,152, filed on Nov. 26, 2008.

(51) Int. Cl.
*G11C 29/00* (2006.01)

(52) U.S. Cl.
USPC .................................. 714/708; 714/773

(58) Field of Classification Search
USPC .......................... 714/773, 780, 708
See application file for complete search history.

(56) References Cited

U.S. PATENT DOCUMENTS

| | | | | |
|---|---|---|---|---|
| 6,212,654 B1* | 4/2001 | Lou et al. | | 714/701 |
| 6,819,589 B1* | 11/2004 | Aakjer | | 365/185.02 |
| 6,862,218 B2* | 3/2005 | Guterman et al. | | 365/185.24 |
| 6,973,604 B2* | 12/2005 | Davis et al. | | 714/710 |
| 7,036,068 B2* | 4/2006 | Davis et al. | | 714/763 |
| 7,099,190 B2* | 8/2006 | Noguchi et al. | | 365/185.09 |
| 7,511,646 B2* | 3/2009 | Cornwell et al. | | 341/126 |
| 7,681,094 B2* | 3/2010 | Guterman et al. | | 714/718 |
| 7,716,538 B2* | 5/2010 | Gonzalez et al. | | 714/709 |
| 7,774,688 B1* | 8/2010 | Teng et al. | | 714/782 |
| 7,836,364 B1* | 11/2010 | Sutardja et al. | | 714/723 |
| 7,876,621 B2* | 1/2011 | Sharon et al. | | 365/185.24 |
| 7,900,125 B1* | 3/2011 | Liu et al. | | 714/799 |
| 7,904,788 B2* | 3/2011 | Brandman et al. | | 714/760 |
| 7,908,543 B2* | 3/2011 | Marelli et al. | | 714/782 |
| 7,975,192 B2* | 7/2011 | Sommer et al. | | 714/719 |
| 8,156,403 B2* | 4/2012 | Shalvi et al. | | 714/764 |

(Continued)

FOREIGN PATENT DOCUMENTS

| | | |
|---|---|---|
| CN | 1268698 | 10/2000 |
| CN | 101211667 | 7/2008 |

(Continued)

OTHER PUBLICATIONS

IEEE Std 802.11b-1999, Part 11: Wireless LAN Medium Access Control (MAC) and Physical Layer (PHY) specifications: Higher-Speed Physical Layer Extension in the 2.4GHz Band, Sep. 16, 1999, pp. 1-96, The Institute of Electrical and Electronics Engineers, Inc., New York, NY.

(Continued)

*Primary Examiner* — Stephen M Baker

(57) ABSTRACT

Embodiments herein provide data recovery techniques and configurations for solid state memory devices. For example, a method includes identifying a hard error associated with a cell of a solid state memory device, providing a location of the cell having the identified hard error to a decoder to recover data originally programmed to the cell, and recovering the data originally programmed to the cell using the decoder. Other embodiments may be described and/or claimed.

7 Claims, 6 Drawing Sheets

U.S. PATENT DOCUMENTS

| | | | |
|---|---|---|---|
| 8,176,389 B2 * | 5/2012 | Horisaki et al. | 714/768 |
| 8,185,801 B2 * | 5/2012 | Dell et al. | 714/763 |
| 2002/0048202 A1 | 4/2002 | Higuchi | |
| 2008/0034272 A1 * | 2/2008 | Wu et al. | 714/763 |
| 2009/0013231 A1 * | 1/2009 | Lam | 714/746 |

FOREIGN PATENT DOCUMENTS

| | | |
|---|---|---|
| JP | 57150196 | 9/1982 |
| JP | 07-191914 | 7/1995 |
| JP | 2002133892 A | 5/2002 |
| JP | 2004531138 A | 10/2004 |
| JP | 2005521269 A | 7/2005 |
| JP | 2006041982 A | 2/2006 |

OTHER PUBLICATIONS

IEEE Std 802.11b-1999/Corr 1-2001, Part 11: Wireless LAN Medium Access Control (MAC) and Physical Layer (PHY) specifications, Amendment 2: Higher-speed Physical Layer (PHY) extension in the 2.4 GHz band—Corrigendum 1, Nov. 7, 2001, pp. 1-23, The Institute of Electrical and Electronics Engineers, Inc., New York, NY.

IEEE P802.11g/D8.2, Part 11: Wireless LAN Medium Access Control (MAC) and Physical Layer (PHY) specifications: Further Higher Data Rate Extension in the 2.4 GHz Band, Apr. 2003, pp. 1-69, The Institute of Electrical and Electronics Engineers, Inc., New York, NY.

* cited by examiner

DATA RECOVERY IN SOLID STATE MEMORY DEVICES

CROSS REFERENCE TO RELATED APPLICATIONS

The present application claims priority to U.S. Provisional Application No. 61/081,546 filed Jul. 17, 2008, U.S. Provisional Application No. 61/088,514 filed Aug. 13, 2008, and U.S. Provisional Application No. 61/118,152 filed Nov. 26, 2008, the entire specifications of which are hereby incorporated by reference in their entirety for all purposes, except for those sections, if any, that are inconsistent with this specification.

TECHNICAL FIELD

Embodiments of the present invention generally relate to memory devices, and more particularly, to data recovery techniques in solid state memory devices.

BACKGROUND

In solid state memory, such as flash memory, data is typically stored in an array of cells using a charge trap or an isolated region of the cells. The cells may, for example, store one bit of information per cell in single-level cell (SLC) devices, or more than one bit per cell in multi-level cell (MLC) devices. A measured threshold voltage of the cell generally corresponds with a value of the data stored on the cell.

Data loss in solid state memory may occur for a variety of reasons including, for example, wear of cell materials and charge leakage. When such data loss is due to cell degradation, a shift in the threshold voltage may occur, resulting in data read errors of the degraded cell. Simply rereading or retransmitting the signal of the cell generally results in the same errors for degraded cells and fails to recover the data. Likewise, erasing and reprogramming the degraded cells generally results in similar errors.

As data density increases, a solid state memory device may rely on error correction code (ECC) for data integrity protection. In the case of an error correction code (ECC) decoding failure, a simple reread or retry of a degraded cell generally gives rise to little improvement over single read operations. Multiple reread and subsequent ECC decoding may be ineffective, for example, because the decoding failure may be a result of write-in error.

SUMMARY

In various embodiments, the present disclosure provides a method comprising identifying a hard error associated with a cell of a solid state memory device, providing a location of the cell having the identified hard error to a decoder to recover data originally programmed to the cell, and recovering the data originally programmed to the cell using the decoder.

In various embodiments, the present disclosure provides a method comprising reading data stored on a cell of a solid state memory device using a modified reference signal that is different than a reference signal normally used to read the data, forming an erasure flag based on the data read from the cell, the erasure flag indicating that at least one value of the data read from the cell is marked for erasure, and decoding the data read from the cell using the erasure flag.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Embodiments of the present invention describe techniques and configurations for improved data recovery in solid state memory devices and for data storage systems based on solid state memory devices. In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," or "in embodiments," which may each refer to one or more of the same or different embodiments. The phrase "in some embodiments" may be used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

The terms "predictor," "optimizer," "analyzer," or "system level manager" may refer to respective hardware and/or software implementing entities, and do not include a human being. For example, the operations performed by the "predictor", "optimizer," "analyzer," or "system level manager" are operations performed by the respective hardware and/or software implementations, e.g., operations that transform data representative of real things from one state to another state. Such operations do not include mental operations performed by a human being.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 1:
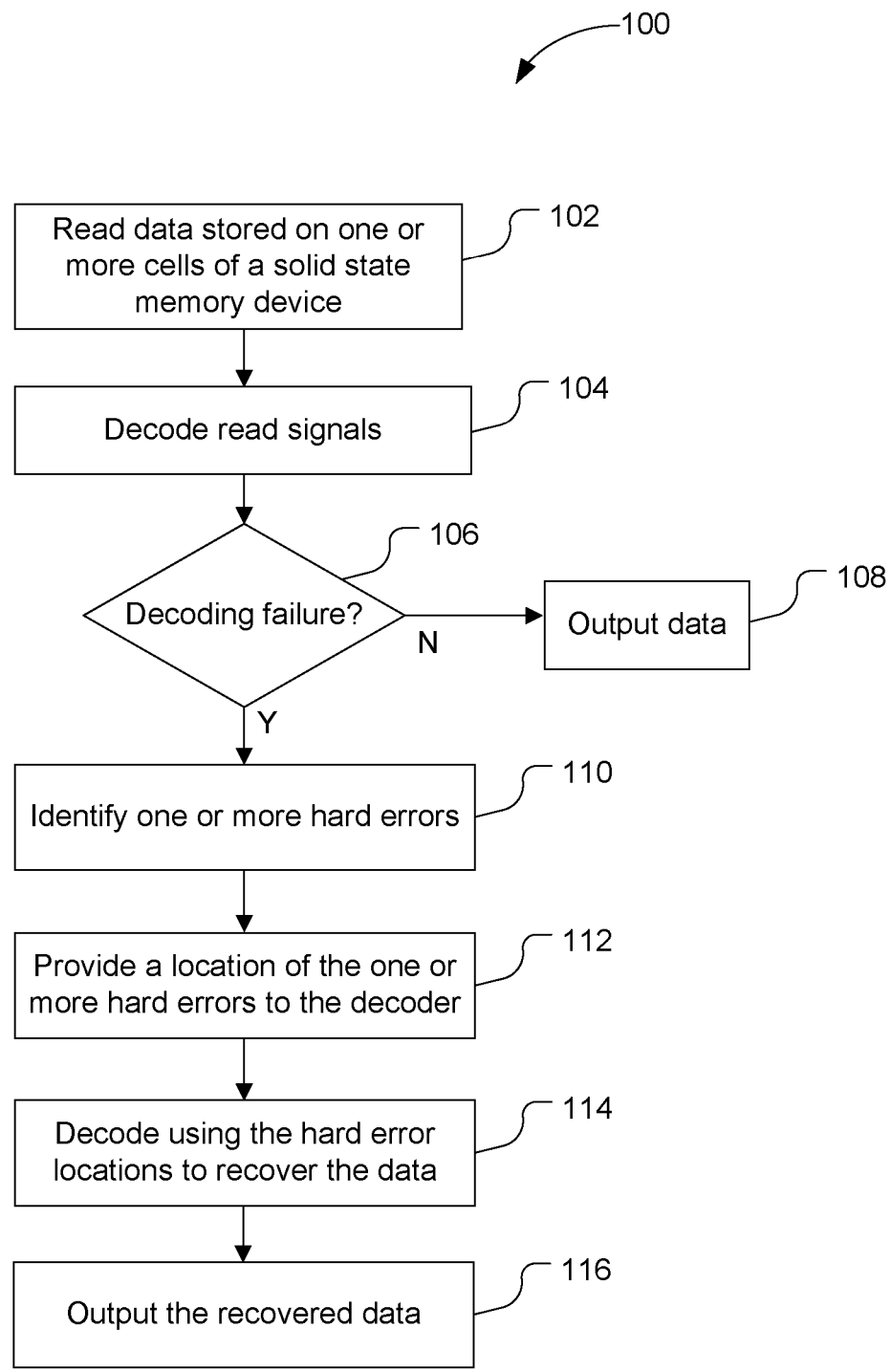
FIG. 1 is a flow diagram of a method to recover data in a solid state memory device.

FIG. 1 is a flow diagram of a method to recover data in a solid state memory device. At block 102, the method 100 includes reading data stored on one or more cells of a solid state memory device. Generally, a read operation relies on comparing a threshold voltage applied to the one or more cells with a reference signal to determine a programmed state of the cell. One or more bits of data may be stored on each cell. The solid state memory device may include memory devices based on semiconductor materials, such as flash memory, but is not limited in this regard.

At block 104, the method 100 includes decoding the read signals. Decoding may be performed, for example, by a variety of soft or hard decoders, such as a Bose, Ray-Chaudhuri, Hocquenghem (BCH) decoder or low-density parity-check (LDPC) decoder. Decoding may include error correction code (ECC) decoding and associated techniques, such as Reed-Solomon decoding and/or Hamming decoding. Subject matter is not limited in this regard and decoding may be performed according to other suitable decoding techniques in other embodiments.

At block 106, a determination is made of whether the decoding fails or succeeds. If the decoding succeeds, the data is output at block 108. If the decoding fails, one or more hard errors are identified at block 110. A hard error includes read and/or decoding errors associated with degraded cells that are typically not repairable. In other words, erase and reprogram operations typically fail to correct hard errors of such cells. An embodiment of identifying one or more hard errors, at block 110, is further described with respect to FIG. 2.

Figure 2:
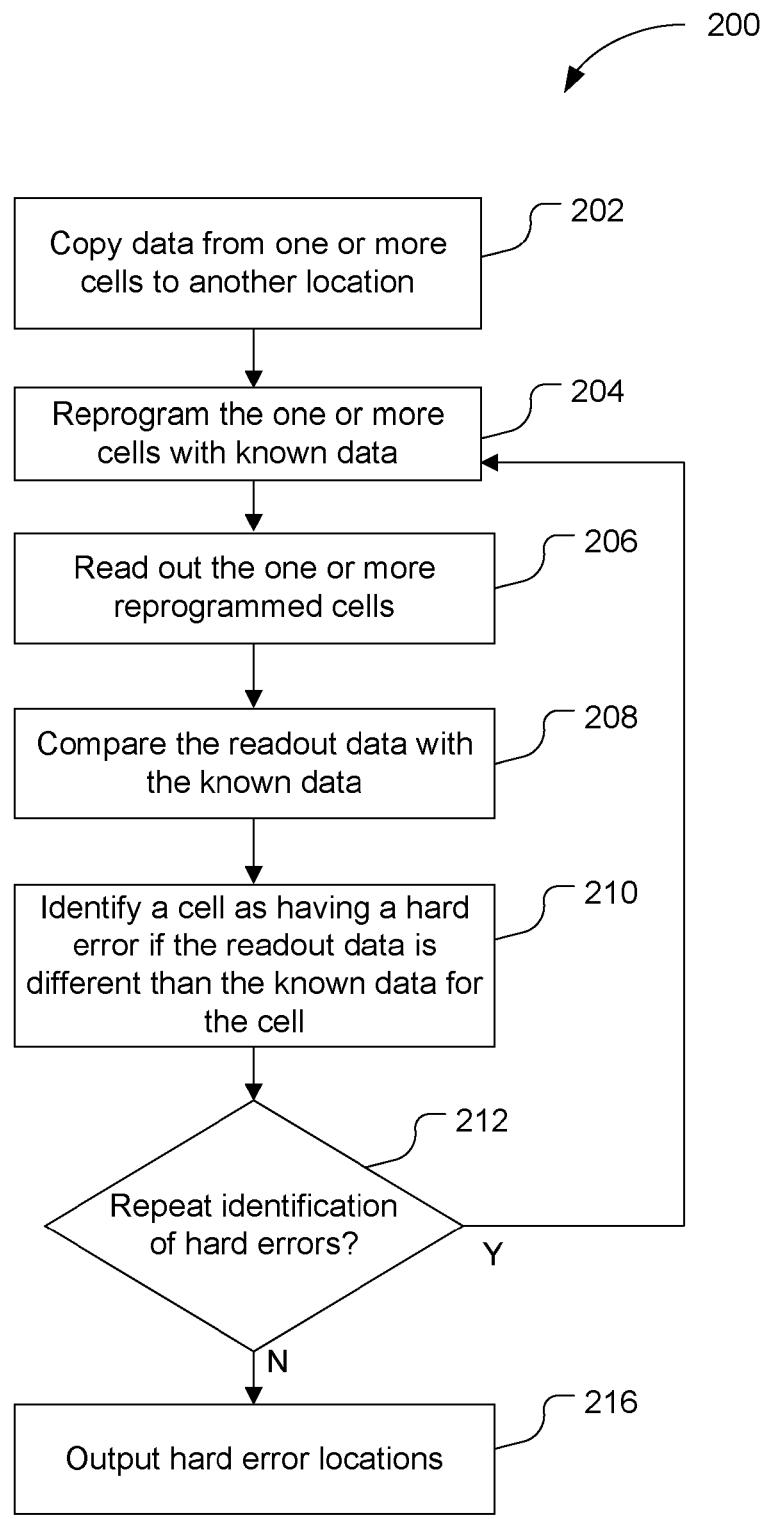
FIG. 2 is a flow diagram of a method to identify hard errors in a solid state memory device.

FIG. 2 illustrates a method 200 to identify the one or more hard errors. The method 200 includes, at block 202, copying the data from the one or more cells that fail decoding at block 106 to another location. The one or more cells that fail decoding at block 106 may be erased, if desired. Then, the one or more hard errors are identified by reprogramming the one or more cells with a known data pattern at block 204, reading out the one or more reprogrammed cells at block 206, and comparing the known data pattern to the readout data pattern at block 208, to identify the locations of the hard errors at block 210. For example, a cell may be identified as having a hard error if the readout data is different than the known data for the cell.

Operations at blocks 204, 206, 208, and 210 may be repeated one or more times, at block 212, using the same or different known data patterns to identify hard errors more accurately and completely. At least one of the known data patterns reprogrammed at block 204 may be similar or based on the data readout at block 102. The hard error locations may be output at block 216. In an embodiment, the known data comprises readout data of the originally programmed data, at block 102, that results in a failure to decode the one or more cells, at block 106.

Returning again to FIG. 1, at block 112, the method 100 includes providing a location of the one or more hard errors to the decoder. The locations of the one or more hard errors are output at block 216 (FIG. 2) of the method 200 and provided to the decoder to improve decoding. Data bits that are stored in degraded cells having identified hard errors may, for example, be marked or flagged as erasures for ECC decoding. Other techniques to record and/or provide locations of cells having identified hard errors may be implemented in other embodiments.

At block 114, the method 100 includes decoding using the hard error locations to recover the originally programmed data, which is the data programmed to the one or more cells prior to being read at block 102. A decoder informed with the hard error locations may provide increased error correction capability. For example, an ECC decoder can erase the bits identified as hard errors for further decoding or flip the bits identified as errors for further decoding. In erasure decoding, a decoder informed with hard error locations can correct 2T erasures, comparing to T erroneous symbols for Reed-Solomon code with error correction power T symbols. Thus, erasure decoding may be used to increase a number of errors that an ECC decoder can correct if the error locations are known. In another example, the informed decoder can implement a bit-flipping technique to retry the decoding with a variety of value combinations for the bits identified with hard errors. Decoding with informed hard error locations may recover the originally programmed data.

In an embodiment, the originally programmed data is recovered, at block 114, by an erasure decoding technique. An example of hard decoding by erasure is provided below to clarify the principles described herein. For example, the originally programmed data may include bit values (1 0 0 0 1 1 0) encoded with Hamming code having error correction power T=1. At block 102, the readout data may, for example, provide bit values having two errors at the third and fourth bits (1 0 1 1 1 1 0). The two errors in the readout data exceed Hamming code correction capability, resulting in an ECC decoding failure at block 106. The data is copied to another block and the current block may be erased, at block 202, to allow identification of the one or more hard errors at block 110.

At block 204, the cells are reprogrammed with a known data pattern. In an embodiment, the known data pattern includes bit values that are each switched from the data readout at block 102. For example, if the data readout at block 102 is (1 0 1 1 1 1 0), the known data pattern may include (0 1 0 0 0 0 1). Reading out the known data pattern, at block 206, may provide bit values (0 1 1 1 0 0 1), which indicate hard errors at the third and fourth bit locations because the readout data is different than the known data pattern at the third and fourth bit locations, in accordance with blocks 208 and 210.

In response to the identified hard error locations, at block 110, the third and fourth bit locations of the originally programmed data are erased and decoded, at block 114. The two erasures allow Hamming decoding to succeed and output the recovered data (1 0 0 0 1 1 0) at block 116.

Similar principles may be used to provide soft decoding by erasure. For example, log-likelihood ratios (LLRs) can be set to zero for corresponding bits identified with hard errors. In a case where the readout data LLRs include (−9.2 +10.5 +13.2 +11.2 −3 −9 +16) and the third and fourth bits are identified as hard errors, the input to a soft decoder may include, for example, LLRs (−9.2 +10.5 0 0 −3 −9 +16).

In another embodiment, the originally programmed data is recovered, at block 114, by a bit-flipping technique. In bit-flipping, combinations of bit values are programmed in the identified hard error positions until decoding succeeds. For example, if originally programmed data (1 0 0 0 1 1 0) encoded with Hamming code is read out as (1 0 1 1 1 1 0), at block 102, then an ECC decoding failure, at block 106, may result because the two errors exceed Hamming code correction capability for error correction T=1. Reprogramming with known data (0 1 0 0 0 0 1) and comparing the readout data (0 1 1 1 0 0 1) of the known data with the known data, at blocks 206 and 208, identifies the hard errors at the third and fourth bit positions, at block 210.

Once the hard error locations are identified, a bit at the hard error position of the originally readout data, at block 102, is flipped in value. For example, the third bit of the readout data (1 0 1 1 1 1 0) may be flipped from 1 to 0 to provide (1 0 0 1 1 1 0). As only one error remains, Hamming decoding at block 114 succeeds to correct the remaining error, and outputs the recovered data (1 0 0 0 1 1 0), at block 116.

Although bit-flipping has been described using an example hard decoder above, bit-flipping may be implemented for a soft decoder as well. Bits corresponding to hard error locations may be exhaustively flipped to the opposite sign for soft decoding. For example, LLRs may be saturated or set to a desired magnitude with sign corresponding to the flipped value. In a case where readout data LLRs include (−9.2 +10.5 +13.2 +11.2 −3 −9 +16) and the third and fourth bits correspond with hard error locations, the third bit may be flipped and saturated to provide (−9.2 +10.5 −16 +11.2 −3 −9 +16) for decoding at block 114. If decoding is successful, the value is output at block 116, otherwise bit-flipping may continue. For example, if decoding fails, the fourth bit may be flipped and saturated and sent to decoding again. If decoding still fails, both the third and fourth bit may be flipped and saturated and sent to decoding again. Bit-flipping of the hard error locations may occur in any order and with any combination of values.

Figure 3:
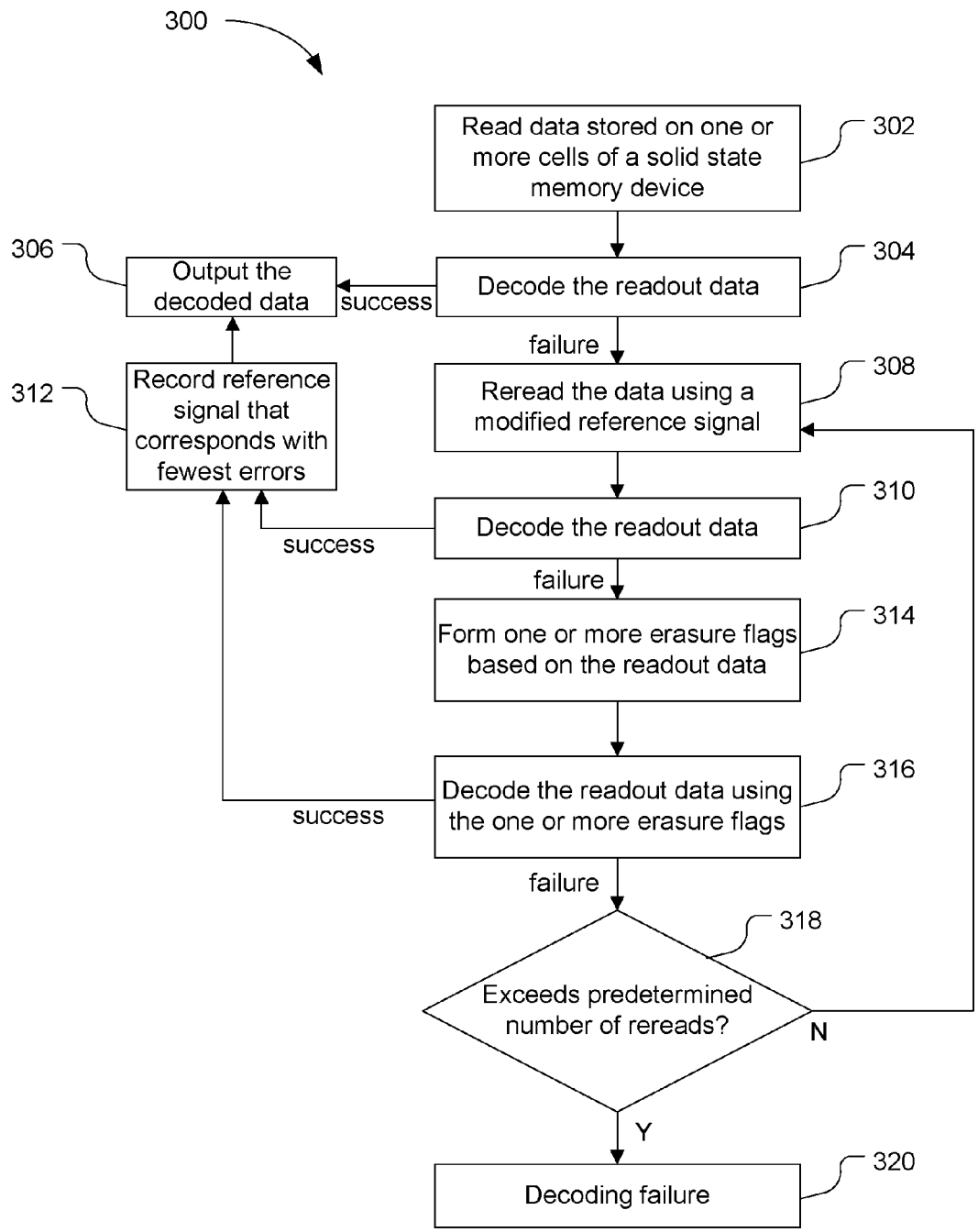
FIG. 3 is a flow diagram of a method for adjusted re-read using a modified reference signal and erasure decoding.

FIG. 3 is a flow diagram of a method 300 for adjusted re-read using a modified reference signal and erasure decoding. At block 302, the method 300 includes reading data stored on one or more cells of a solid state memory device. The one or more cells may be read, for example, by comparing a threshold voltage applied to a cell with a reference signal to determine a programmed state of the cell. Threshold voltages for different cells may vary for a variety of reasons. For example, the variations may be due to differences in programming and/or other cell characteristics, such as wear of the cell material or leakage.

Figure 4:
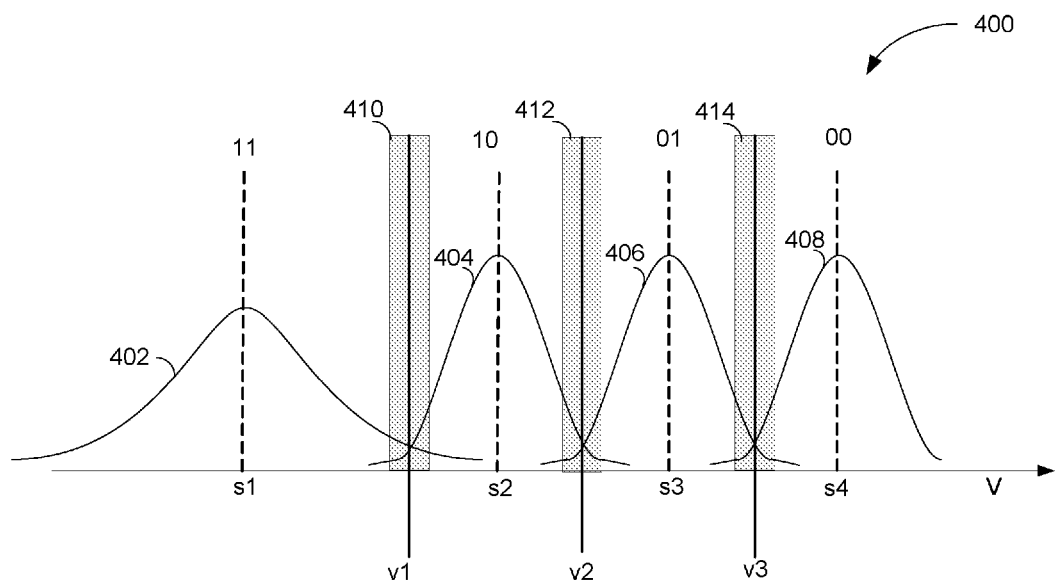
FIG. 4 schematically illustrates an example plot of threshold voltage distributions and reference signals for a multi-level cell memory device.

Referring briefly to FIG. 4, an example plot 400 schematically illustrates threshold voltage distributions 402, 404, 406, 408, statistically distributed around an ideal mean S1, S2, S3, S4 for each of four respective bit values (11), (10), (01), (00) of a two-bit cell. Plot 400 further depicts reference signals v1, v2, v3 that are used to determine the programmed state of the cell. For example, if the threshold voltage of a cell is found to be lower than the reference signal, v1, along voltage axis, V, then the data stored in the cell is read to be (11).

Cells that have threshold voltages in the shaded regions 410, 412, 414 are susceptible to read and/or decoding errors due to their proximity to the reference signals v1, v2, v3. Small noise or disturbance during a read operation can result in a change in detected bit value across the nearest reference signal for such cells. Such marginal cells may provide effective erasure targets for erasure decoding.

Returning again to FIG. 3, the method 300 further includes decoding the readout data, at block 304. If decoding is successful, then the decoded data is output, at block 306. Otherwise, for a decoding failure, the data is reread using a modified reference signal, at block 308. Rereading with a modified reference signal may generate more effective erasures, resulting in more effective erasure decoding.

Figure 5:
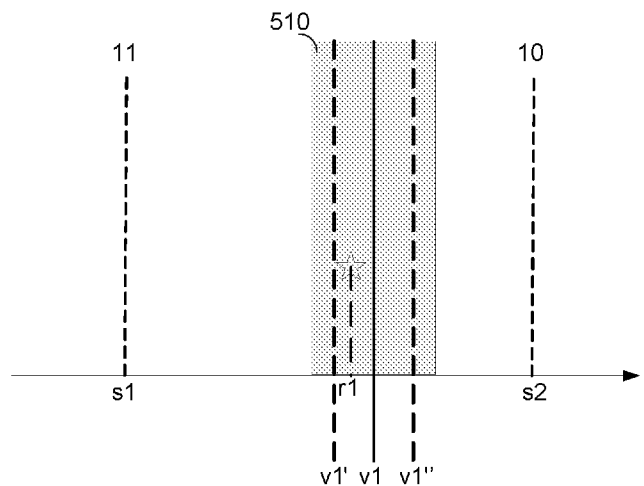
FIG. 5 schematically illustrates a modified reference signal.

Marginal cells are more effectively identified by modifying the reference signals during reread, at block 308. Referring briefly to FIG. 5, for example, a threshold voltage, r1, represented by the star symbol, lies within a shaded region 510 near a reference signal, v1, which is normally used to read the data. If r1 is read using the normally used reference signal v1, for example, the value would be detected to be (11). However, the detected data for r1 is becomes (10) instead of (11) if a modified reference signal v1' is used. The data from rereads using modified reference signals can be compared with each other and/or the readout data obtained using the normal reference signal. If any of the data are different, the locations for the data are marked or flagged as erasures for erasure decoding.

Returning again to FIG. 3, the method 300 includes decoding the readout data, at block 310. Rereading the data using the modified reference signal, at block 308, may provide a value that allows decoding to succeed. If decoding is successful, the data may be output at block 306. In an alternative embodiment, if decoding is successful, the reference signal that corresponds with the fewest errors is recorded, at block 312, for future use. For example, the decoder may obtain the number of errors encountered during reread and decoding, at blocks 308 and 310, corresponding to the reference signal used. The reference signal corresponding to the fewest errors may be saved, for example, by a system coupled to the solid state memory device or in the solid state memory device for future use in reading data from the marginal cell. In various embodiments, blocks 310 and 312 are not used at all and block 314 follows block 308.

At block 314, the method 300 includes forming one or more erasure flags based on the readout data from block 308. The erasure flag may indicate that at least one value of the data read from the cell is marked for erasure. The at least one value may be, for example, a bit value of the data read from the cell. For example, the readout data from different rereads according to block 308 and/or the readout data obtained using the normally used reference signal according to block 302 can be compared with each other and differences in the data can be marked as erasure locations for erasure decoding.

Figure 6:
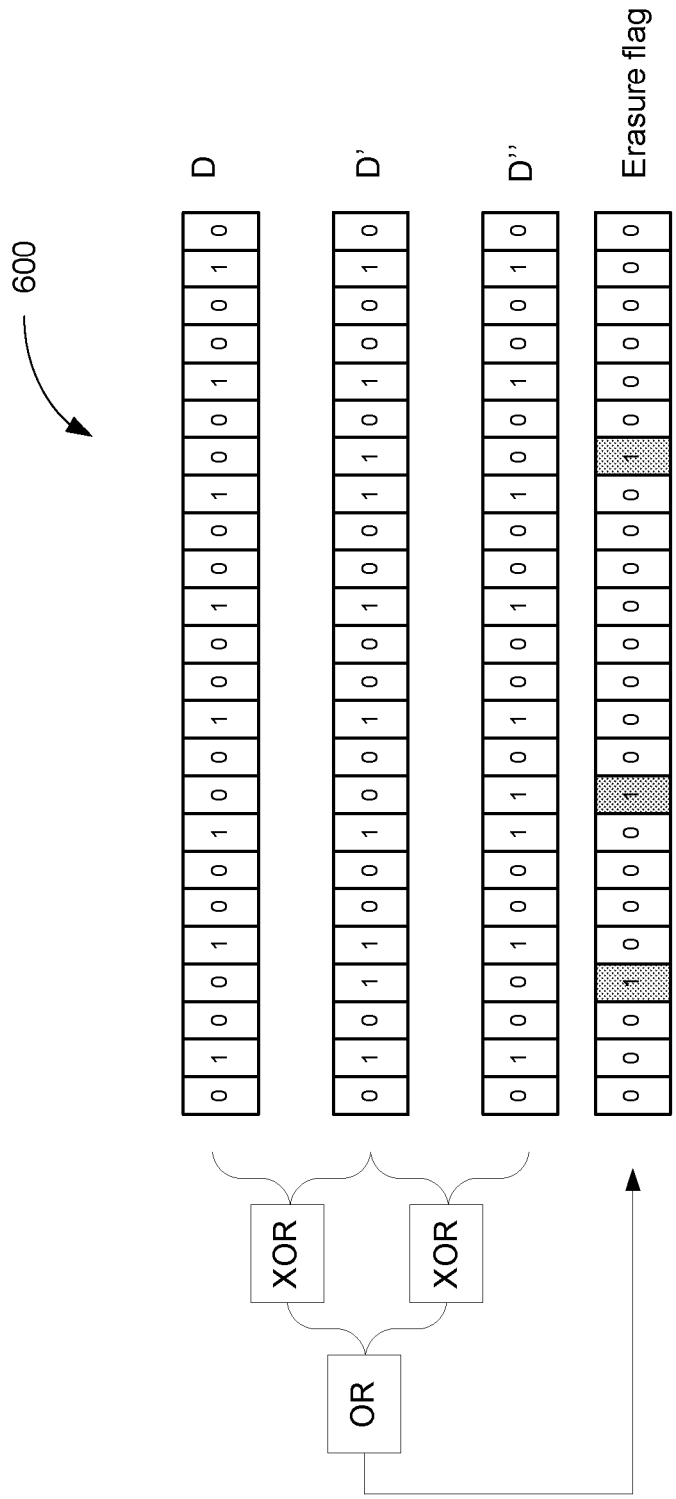
FIG. 6 schematically illustrates an example erasure flag vector.

Referring briefly to FIG. 6, an example erasure flag vector 600 that may be used according to various embodiments is schematically illustrated. The readout data denoted by D correspond with a normally used reference signal (e.g., v1 of FIG. 5) and may be obtained from the readout data of block 302. The readout data denoted by D' and D" correspond with different modified reference signals (e.g., v1' and v1" of FIG. 5) and may be obtained from the readout data of block 308, which may iterate as denoted at block 318. The erasure flag vector 600 can be formed using an OR of XOR(D, D') and XOR(D', D"), as depicted, where the shaded data locations indicate flagged erasures. Subject matter is not limited to this example and an erasure flag of a bit may be set if the bit changed during any of the reread operations at block 308 using a variety of suitable techniques.

An alternative technique to mark erasures for multiple rereads, for example, includes flagging for erasure a bit associated with the one or more marginal cells if a number of times that the bit is read to have a value favored by a majority decoding principle of the solid state memory device is less than the number of times that the bit is read to be another value by a threshold amount (e.g., threshold of 1), otherwise the bit is set to have the value favored by the majority decoding principle. Erasure flags may be set, for example, in either bit-wise or symbol-wise.

At block 316, the method 300 includes decoding the readout data using the one or more erasure flags. If successful, the reference signal that corresponds with the fewest errors is optionally recorded, at block 312, and the decoded data is output, at block 306.

Operations 308, 310, 314, and 316 may repeat until decoding is successful at block 316 or a number of predetermined rereads are exceeded at block 318. In an embodiment, the reread operation at block 308 is performed at least twice. Such reread operation may comprise reading the data using a modified reference signal (e.g., voltage) that is higher than the normally used reference signal for the cell being read and reading the data using a modified reference signal that is lower than the normally used reference signal. Any suitable number of rereads may be used as a threshold for block 318. If the threshold is exceeded, a decoding failure may result at block 320.

Techniques described herein may be implemented in software, hardware or firmware, or combinations thereof. Operations described herein may be performed, for example, by a decoder or signal transmitters and/or receivers. In various embodiments, a predictor, optimizer, analyzer, or system level manager may be used to perform actions described herein. In various embodiments, techniques described herein are performed by a module designed to perform such functions. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 7:
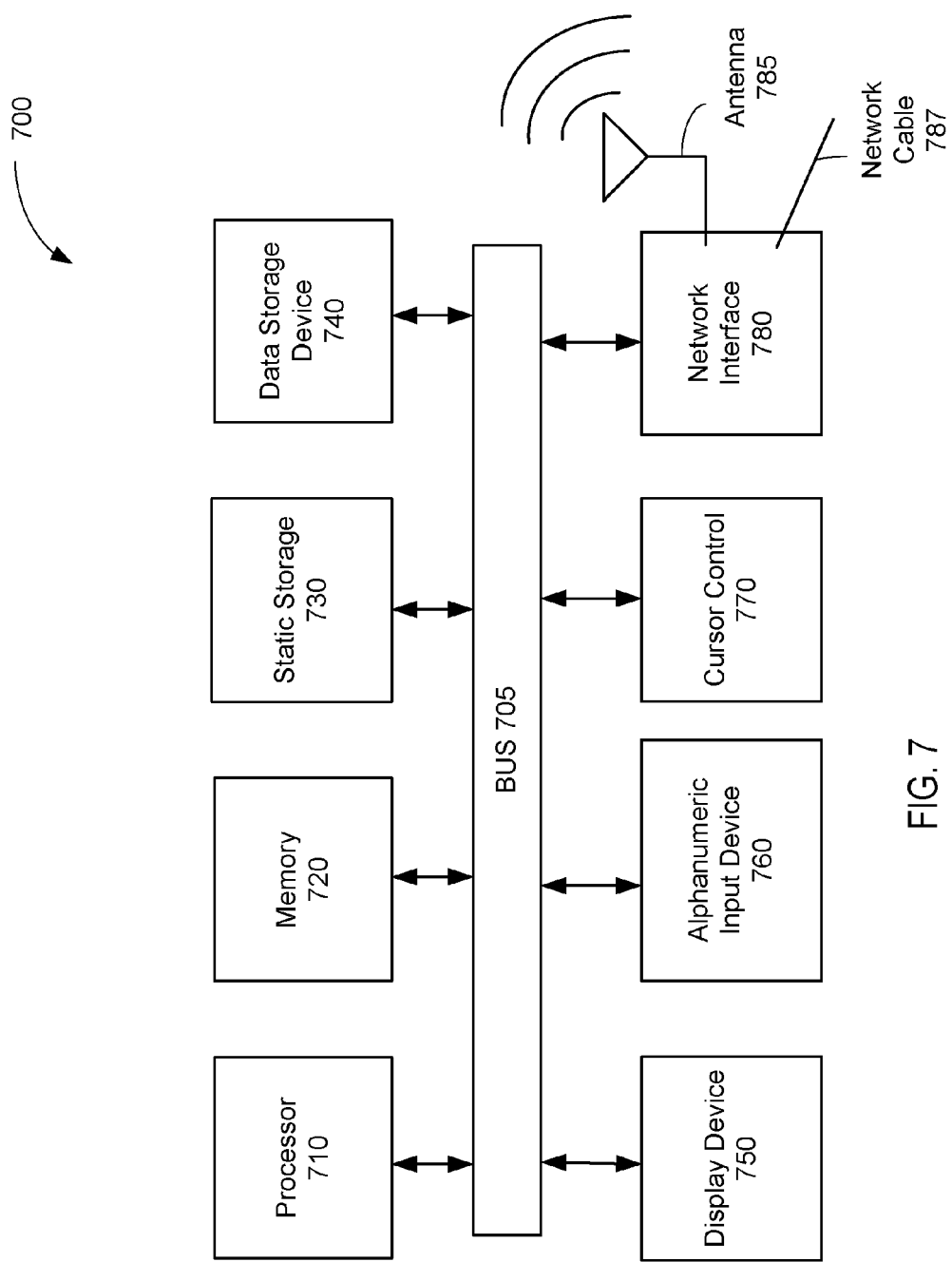
FIG. 7 schematically illustrates an example electronic system for implementing techniques of a solid state memory device as described herein.

FIG. 7 is a schematic diagram of an example electronic system for implementing techniques and configurations described herein. Electronic system 700 may comport with embodiments already described herein. Electronic system 700 is intended to represent a variety of electronic devices (either wired or wireless) including, for example, desktop computer devices, laptop computer devices, personal computers (PC), servers, telephones, personal digital assistants (PDA) including cellular-enabled PDAs, set top boxes, pocket PCs, tablet PCs, DVD players, video players, copiers, printers, or multi-function devices (MFD), but is not limited to these examples and may include other electronic devices. Alternative electronic systems may include more, fewer and/or different components.

Electronic system 700 includes bus 705 or other communication device or interface to communicate information, and processor 710 coupled to bus 705 that may process information. Bus 705 may be a single system bus or a number of buses of the same or different types bridged together. System 700 may include one or more processors and/or co-processors.

In an embodiment, system 700 includes random access memory (RAM) or other storage device 720 (may be referred to as "memory"), coupled to bus 705. Memory 720 may also be used to store temporary variables or other intermediate information during execution of instructions by processor 710. Memory 720 may include a flash memory device. In an embodiment, memory 720 comprises a solid state memory device as described herein. Processor 710 may be coupled with memory 720 to execute instructions stored thereon, that if executed, result in the actions or operations described herein.

System 700 also includes read only memory (ROM) and/or other static storage device 730 coupled to bus 705 to store static information and instructions for processor 710. Data storage device 740 may be coupled to bus 705 to store information and instructions. Data storage device 740 may include, for example, a magnetic hard disk drive (HDD).

In an embodiment, an article of manufacture is disclosed. The article of manufacture includes a storage medium such as memory 720, static storage 730, data storage device 740, or other computer-readable medium having instructions stored thereon that, if executed, result in the actions described herein. The instructions may be in the form of firmware or software according to various embodiments.

Electronic system 700 is coupled via bus 705 to display device 750, such as a cathode ray tube (CRT) or liquid crystal display (LCD), to display information to a user. Alphanumeric input device 760, including alphanumeric and other keys, may be coupled to bus 705 to communicate information and command selections to processor 710. Cursor control 770 may be another type of input device and may include, for example, a mouse, a trackball, or cursor direction keys to communicate information and command selections to processor 710 and to control cursor movement on display 750.

Electronic system 700 further includes one or more network interfaces 780 to provide access to network 720, such as a local area network, but is not limited in this regard. Network interface 780 may include, for example, a wireless network interface having antenna 785, which may represent one or more antennae. Network interface 780 may also include, for example, a wired network interface to communicate with remote devices via network cable 787, including, for example, an Ethernet cable, a coaxial cable, a fiber optic cable, a serial cable, or a parallel cable.

In one embodiment, network interface 780 provides access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

Although certain embodiments have been illustrated and described herein for purposes of, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
reading data stored on a cell of a solid state memory device using a plurality of modified reference signals, wherein each of the plurality of modified reference signals is different than a corresponding reference signal normally used to read the data stored on the cell;
obtaining a number of errors for each modified reference signal of the plurality of modified reference signals used during the reading of the data stored on the cell;
recording a modified reference signal of the plurality of modified reference signals having the fewest number of errors;
forming an erasure flag based on the data read from the cell, the erasure flag indicating that at least one value of the data read from the cell is marked for erasure; and
decoding the data read from the cell using the erasure flag.

2. The method of claim 1, wherein the reading of the data stored on the cell is part of a re-read operation of the data stored on the cell, and wherein the reading of the data is performed in response to a decoding failure of the data.

3. The method of claim 1, wherein forming the erasure flag further comprises:
   comparing the data read from the cell using a corresponding normally used reference signal with the data read from the cell using a modified reference signal of the plurality of modified reference signals; and
   flagging for erasure the at least one value of data if at least one value of data read from the cell using a corresponding normally used reference signal is different from at least one value read from the cell using a modified reference signal of the plurality of modified reference signals.

4. The method of claim 1, wherein decoding the data read from the cell using the erasure flag comprises erasure decoding.

5. The method of claim 1, further comprising outputting the decoded data.

6. The method of claim 1, wherein the reading of the data stored on the cell is performed multiple times, and comprises:
   reading the data using a modified reference signal that is higher than a corresponding normally used reference signal; and
   reading the data using a modified reference signal that is lower than a corresponding normally used reference signal.

7. The method of claim 6, wherein forming the erasure flag further comprises:
   flagging for erasure the at least one value of data if a number of times that the at least one value of data is read to be associated with a majority decoding principle of the solid state memory device is less than the number of times that the at least one value of data is read to be associated with another value by a threshold amount; and
   setting the at least one value of data to be associated with the majority decoding principle if the number of times that the at least one value of data is read to have the value of data associated with the majority decoding principle is greater than the number of times that the at least one value of data is read to be associated with another value.

* * * * *